US008937490B2

(12) United States Patent
Moon et al.

(10) Patent No.: US 8,937,490 B2
(45) Date of Patent: Jan. 20, 2015

(54) OUTPUT DRIVER, DEVICES HAVING THE SAME, AND GROUND TERMINATION

(71) Applicants: David Moon, Seoul (KR); Yong Cheol Bae, Yongin-si (KR); Min Su Ahn, Suwon-si (KR); Young Jin Jeon, Hwaseong-si (KR)

(72) Inventors: David Moon, Seoul (KR); Yong Cheol Bae, Yongin-si (KR); Min Su Ahn, Suwon-si (KR); Young Jin Jeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 13/659,543

(22) Filed: Oct. 24, 2012

(65) Prior Publication Data

US 2013/0099823 A1    Apr. 25, 2013

Related U.S. Application Data

(60) Provisional application No. 61/550,564, filed on Oct. 24, 2011.

(30) Foreign Application Priority Data

Feb. 22, 2012    (KR) ........................ 10-2012-0017823

(51) Int. Cl.
*H03K 19/094*    (2006.01)
*H04L 25/02*    (2006.01)
*H03K 19/0185*    (2006.01)

(52) U.S. Cl.
CPC ...... *H04L 25/028* (2013.01); *H03K 19/018521* (2013.01); *H03K 19/01855* (2013.01); *H04L 25/0292* (2013.01)

USPC .................... 326/87; 326/27; 326/83; 326/93

(58) Field of Classification Search
CPC .................... H03K 19/017454; G06F 13/4086
USPC ........................ 326/21, 26, 27, 30, 83, 87, 93
See application file for complete search history.

(56) References Cited

U.S. PATENT DOCUMENTS

| 5,467,455 | A | * | 11/1995 | Gay et al. ...................... 710/100 |
| 5,877,635 | A | * | 3/1999 | Lin ................................. 326/83 |
| 6,141,263 | A | | 10/2000 | Protzman |
| 7,982,493 | B1 | | 7/2011 | Kim |
| 8,102,186 | B2 | * | 1/2012 | Komyo et al. ................... 326/30 |
| 8,315,122 | B2 | * | 11/2012 | Jo et al. ..................... 365/230.03 |
| 2004/0165692 | A1 | | 8/2004 | Moon et al. |
| 2005/0007145 | A1 | * | 1/2005 | Dreps et al. ...................... 326/30 |
| 2013/0002290 | A1 | * | 1/2013 | Gondi et al. .................... 326/30 |
| 2014/0015565 | A1 | * | 1/2014 | Xia et al. ........................ 326/41 |

FOREIGN PATENT DOCUMENTS

JP        2000357745 A    12/2000

* cited by examiner

*Primary Examiner* — Don Le
(74) *Attorney, Agent, or Firm* — Harness, Dickey & Pierce, P.L.C.

(57) ABSTRACT

An integrated circuit comprising an output driver including an output terminal, and a receiving circuit including a termination resistor connected between the output terminal and a ground. The output driver comprising a first NMOS transistor configured to pull up a voltage of the output terminal to a pull-up voltage in response to a pull-up signal, and a second NMOS transistor configured to pull down the output terminal to a ground voltage in response to a pull-down signal.

20 Claims, 17 Drawing Sheets

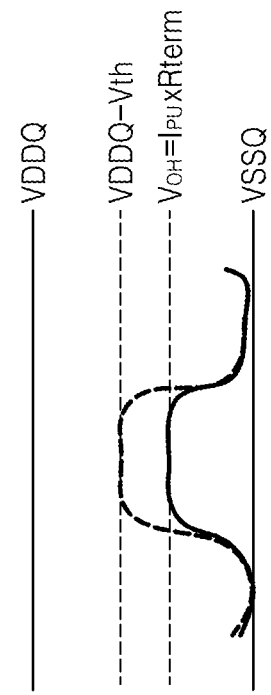
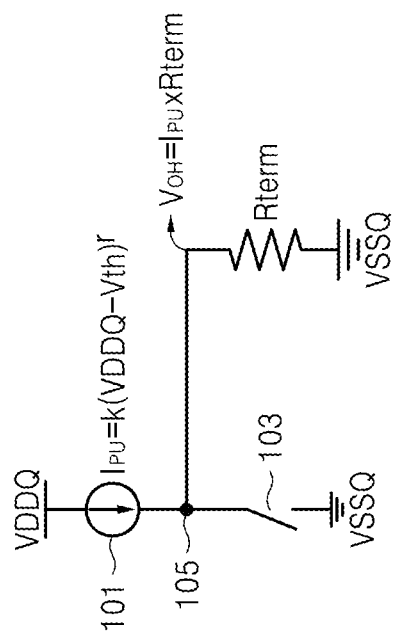
FIG. 2B
FIG. 2A

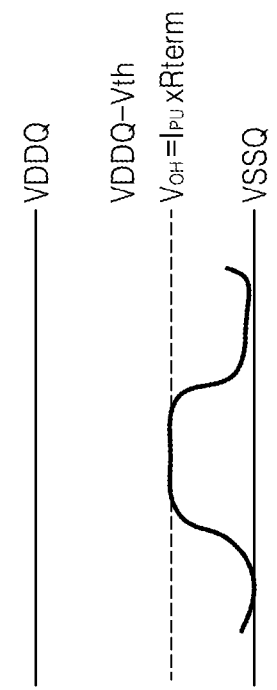
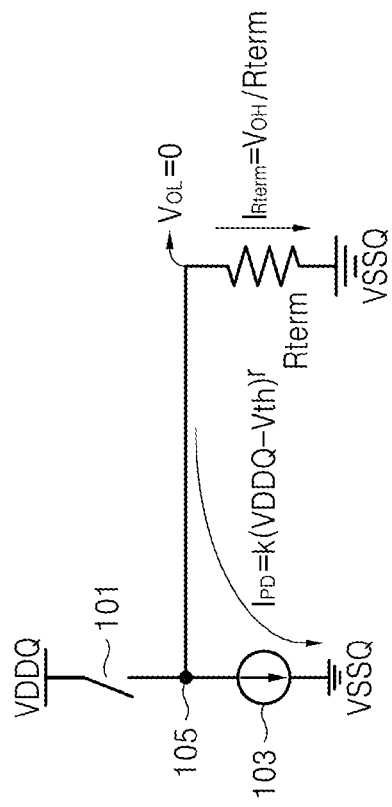

OUTPUT DRIVER, DEVICES HAVING THE SAME, AND GROUND TERMINATION

CROSS-REFERENCE TO RELATED APPLICATIONS

This application claims the priority benefit of U.S. provisional patent application No. 61/550,564 filed on Oct. 24, 2011 and the priority benefit under 35 U.S.C. §119 (a) from Korean Patent Application No. 10-2012-0017823 filed on Feb. 22, 2012, the disclosure of which is hereby incorporated by reference in its entirety.

BACKGROUND

Embodiments of the present inventive concepts relate to an interface circuit, and more particularly, to an output driver using an n-type metal-oxide semiconductor (NMOS) transistor as a pull-up driver, devices having the same, and/or ground termination.

A conventional output driver is connected in series between a power line and a ground line and includes a PMOS transistor used as a pull-up driver and an NMOS transistor used as a pull-down driver.

As carrier mobility, e.g., hole mobility, of the p-type metal-oxide semiconductor (PMOS) transistor is less than carrier mobility, e.g., electron mobility, of the NMOS transistor, a size of the PMOS transistor may be designed 2.5 times bigger than a size of the NMOS transistor.

A size of a first pre-driver driving the PMOS transistor is designed bigger than a size of a second pre-driver driving the NMOS transistor. Accordingly, an amount of current flowing in the first pre-driver is more than an amount of current flowing in the second pre-driver.

Moreover, as the NMOS transistor operates in a linear region when a power voltage is used as a termination of a channel transmitting an output signal from an output driver, a current flowing in the NMOS transistor should be increased for desired data signaling.

SUMMARY

An embodiment of the present invention is directed to an integrated circuit, including an output driver including an output terminal, and a receiving circuit including a termination resistor connected between the output terminal and a ground. The output driver includes a first NMOS transistor configured to pull up a voltage of the output terminal to a pull-up voltage in response to a pull-up signal and a second NMOS transistor configured to pull down the voltage of the output terminal to a ground voltage in response to a pull-down signal.

The receiving circuit further includes a switch connecting the termination resistor and the ground, the switch being activated in response to a control signal.

The integrated circuit further includes a pre-driver circuit configured to generate the pull-up signal and the pull down signal, which are complementary to each other, in response to an enable signal and output data, a sense-amplifier configured to sense and to amplify input data input through the output terminal in response to a clock signal, and a control circuit configured to decode a command and to control activation of one of the enable signal and transmission of the clock signal according to an interpretation result.

An example embodiment of the present inventive concepts is directed to a system, including a first data processing circuit and a second data processing circuit which communicate with each other through a channel. The first data processing circuit includes a first output driver having a first output terminal connected to the channel. The first output driver includes a first NMOS transistor configured to pull up a voltage of the first output terminal to a pull-up voltage of the first data processing circuit and a second NMOS transistor configured to pull down a voltage of the first output terminal to a ground voltage of the first data processing circuit. The second data processing circuit includes a first termination resistor connected between the channel and a ground of the second data processing circuit.

The first data processing circuit further includes a second termination resistor connected between the channel and a ground of the first data processing circuit. The second data processing circuit further includes a second output driver having a second output terminal connected to the channel. The second output driver includes a third NMOS transistor configured to pull up a voltage of the second output terminal to a pull-up voltage of the second data processing circuit in response to a second pull up signal and a fourth NMOS transistor configured to pull down the second output terminal to a ground voltage of the second data processing circuit in response to a second pull-down signal.

According to an example embodiment, the system is a system-on chip.

According to another example embodiment, the first data processing circuit is a master using a serial communication protocol, and the second data processing circuit is a slave using the serial communication protocol.

According to still another example embodiment, the system is a multi-chip package.

According to still another example embodiment, the system further includes a board where the first data processing circuit and the second data processing circuit are mounted, and the system is a memory module.

According to still another example embodiment, the system further includes a central processing unit (CPU) configured to communicate with the first data processing circuit and the second data processing circuit through a data bus, and the system is a personal computer (PC).

According to yet another example embodiment, the system includes a channel that is configured to transmit optical signals.

An example embodiment of the present inventive concepts is directed to a data processing method, including generating a pull-up signal and a pull-down signal which are complementary to each other in response to first data, and transmitting the first data to a channel by using selectively an NMOS pull-up transistor which operates in response to the pull-up signal and an NMOS pull-down transistor which operates in response to the pull-down signal.

The data processing method further includes sensing and amplifying second data input to the channel which is terminated to a ground via a termination resistor.

According to an example embodiment, the transmitting and the amplifying may each be performed in a single device.

According to another example embodiment, the transmitting and the amplifying may each be performed in different devices.

Another example embodiment of the present inventive concepts is directed to a data processing method, including terminating a channel through which data are transmitted to a ground through a termination resistor and processing the data transmitted via the channel.

According to an example embodiment of the present inventive concepts, an output driver including an output terminal includes a first NMOS transistor configured to pull up a voltage of the output terminal to a pull-up voltage in response to a pull up signal, a second NMOS transistor configured to pull down the voltage of the output terminal to a ground voltage in response to a pull-down signal, and a pre-driver circuit configured to generate the pull-up signal and the pull-down signal, which are complementary to each other, in response to a clock signal and data.

According to an example embodiment, the output driver further includes a resistance circuit connected between the output terminal and a data pad.

Difference between a threshold voltage of the first NMOS transistor and a threshold voltage of the second NMOS transistor may be 50 mV to 100 mV.

According to another example embodiment, the output driver further includes a third NMOS transistor which pulls up the output terminal to the pull-up voltage in response to the pull-up signal, and difference between a threshold voltage of the first NMOS transistor and a threshold voltage of the third NMOS transistor may be 50 mV to 100 mV.

According to still another example embodiment, the output driver further includes a third NMOS transistor configured to pull down a voltage of the output terminal to the ground voltage in response to the pull-down signal, and a difference between a threshold voltage of the second NMOS transistor and a threshold voltage of the third NMOS transistor may be 50 mV to 100 mV.

According to still another example embodiment, the output driver further includes a third NMOS transistor configured to pull up a voltage of the output terminal to the pull-up voltage in response to the pull-up signal and a fourth transistor configured to pull down the voltage of the output terminal to the ground voltage in response to the pull-down signal. The difference between a threshold voltage of the first NMOS transistor and a threshold voltage of the third NMOS transistor is 50 mV to 100 mV, and difference between a threshold voltage of the second NMOS transistor and a threshold voltage of the fourth NMOS transistor is 50 mV to 100 mV.

According to still another example embodiment, the output driver further includes a control signal generation circuit configured to generate a control signal in response to a clock signal and the pull-down signal, and a third NMOS transistor configured to pull down the voltage of the output terminal to the ground voltage in response to the control signal. A difference between a threshold voltage of the first NMOS transistor and a threshold voltage of the second NMOS transistor is 50 mV to 100 mV, and a difference between threshold voltage of the second NMOS transistor and a threshold voltage of the third NMOS transistor is 50 mV to 100 mV.

According to still another example embodiment, the output driver further includes a control signal generation circuit which determines dependency of the pull-down signal input at each time point in response to a clock signal and generates a control signal based on a determination result, and a third NMOS transistor configured to pull down the output terminal to the ground voltage in response to the control signal.

According to still another example embodiment, the output driver further includes a control signal generation circuit configured to generate a control signal in response to a clock signal and the pull-up signal, and a third NMOS transistor configured to pull up the voltage of the output terminal to the pull-up voltage in response to the control signal.

According to still another example embodiment, the output driver further includes a control signal generation circuit configured to determine dependency of the pull-up signal input at each time point in response to a clock signal and configured to generate a control signal based on a determination result, and a third NMOS transistor configured to pull up the voltage of the output terminal to the pull-up voltage in response to the control signal.

According to still another example embodiment, an output driver includes an output terminal, a first transistor configured to pull up a voltage of the output terminal to a pull up voltage in response to a pull up signal, a second a second transistor connected in series between the first transistor and a ground, the second transistor configured to pull down the voltage of the output terminal to a ground voltage, in response to a pull-down signal, wherein neither the first transistor nor the second transistor is a p-type metal-oxide semiconductor (PMOS) transistor.

According to an example embodiment, the threshold voltage of the first non-p-type transistor is less than the threshold voltage of the second non-p-type transistor.

According to still another embodiment, threshold voltage of the first non-p-type transistor is greater than the threshold voltage of the second non-p-type transistor.

According to yet another example embodiment, the output driver further includes a third transistor configured to pull up the voltage of the output terminal to the pull-up voltage in response to the pull-up signal and a fourth transistor configured to pull down the voltage of the output terminal to the ground voltage in response to the pull-down signal, wherein neither the third transistor nor the fourth transistor is a p-type metal-oxide semiconductor (PMOS) transistor.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which:

FIG. 2a is a schematic drawing illustrating an operation of a pull-up driver of the output driver of FIG. 1;

FIG. 2b is a timing diagram of an output signal according to the operation illustrated in FIG. 2a;

FIG. 3a is a schematic drawing illustrating an operation of a pull down driver of the output driver of FIG. 1;

FIG. 3b is a timing diagram of an output signal according to the operation illustrated in FIG. 3a;

DETAILED DESCRIPTION OF THE PREFERRED EMBODIMENTS

Figure 1:
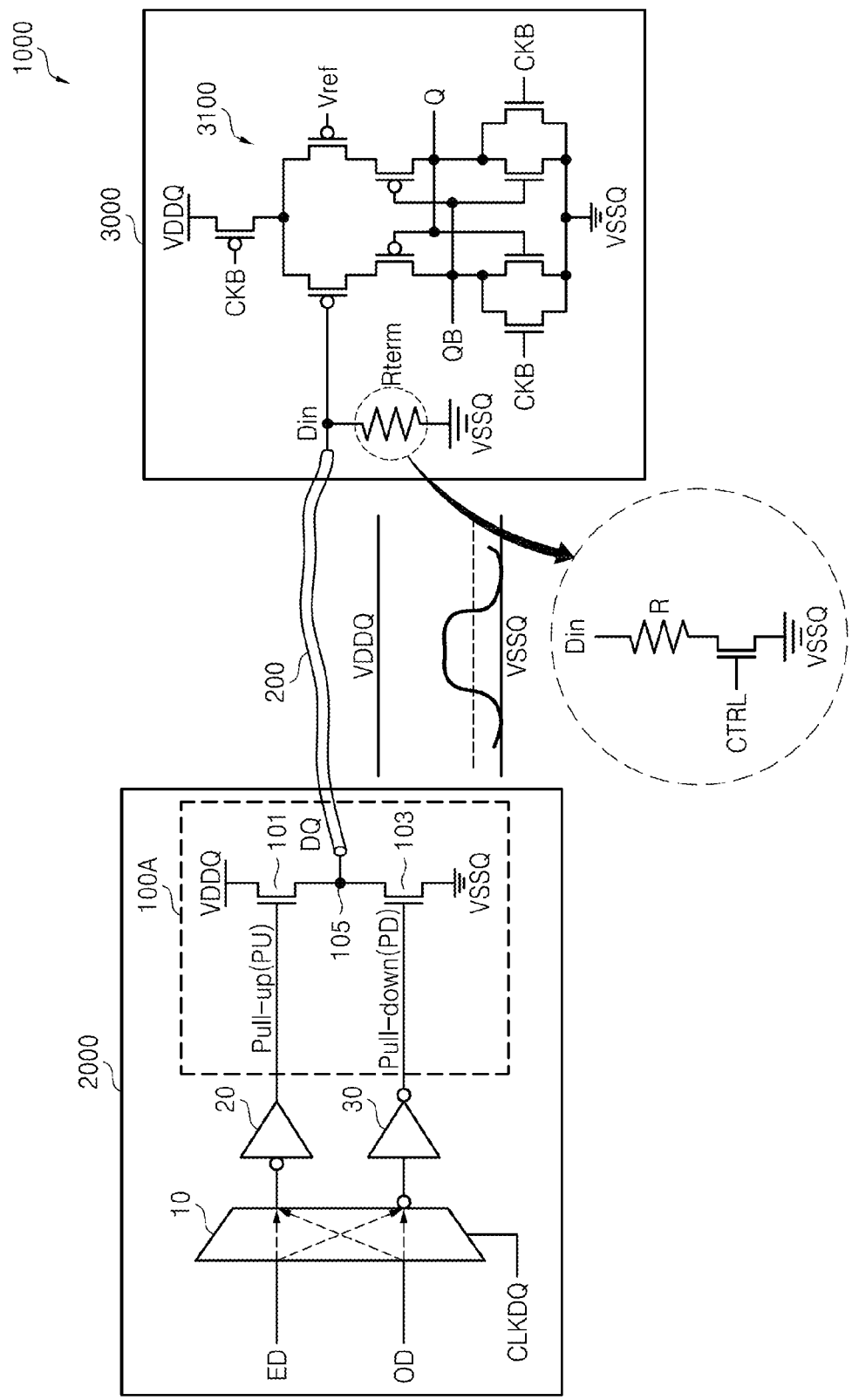
FIG. 1 is a schematic block diagram of a data transmission system including an output driver and a ground termination according to an example embodiment of the present inventive concepts.

The present inventive concepts now will be described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of a data transmission system including an output driver and a ground termination according to an example embodiment of the present inventive concepts. Referring to FIG. 1, the data transmission system 1000 may include a first device 2000 and a second device 3000 which perform data communication through a channel 200. According to an example embodiment, the first device 2000 and the second device 3000 may be embodied in a same chip or different chips.

The first device 2000 may perform a function of a transmitter transmitting data to the channel 200, and the second device 3000 may perform a function of a receiver receiving and processing data input through the channel 200.

Here, the channel 200 is a data path for transmitting data, and it may be embodied in a line or a bus. For example, the line or the bus may be embodied on or inside a printed circuit board (PCB).

In addition, the data path may be an electrical path or an optical path. The optical path may be an optical interconnection means. For example, the optical connection means may mean an optical fiber, an optical waveguide or a medium transmitting an optical signal.

According to an example embodiment, the data transmission system 1000 may be embodied in a personal computer (PC) or a portable device.

The portable device may be embodied in any appropriate device, non-limiting examples include: a laptop computer, a cellular phone, a smart phone, a tablet PC, a personal digital assistant (PDA), an enterprise digital assistant (EDA), a digital still camera, a digital video camera, a portable multimedia player (PMP), a personal navigation device or a portable navigation device (PDN), a handheld game console and an e-book.

According to another example embodiment, the data transmission system 1000 may be embodied in a memory module where the first device 2000 and the second device 3000 are mounted on a board. The memory module may be embodied in a single in-line memory module (SIMM), a dual inline memory module (DIMM), a small outline dual in-line memory module (SO-DIMM), a fully buffered DIMM (FB-DIMM) or an unbuffered DIMM.

The first device 2000 performing a function of a transmitter may include a selection circuit 10, a plurality of pre-drivers 20 and 30, and an output driver 100A.

The selection circuit 10 may transmit first data, e.g., even numbered data ED, to each pre-driver 20 and 30 in response to one of a rising edge and a falling edge of a selection signal, e.g., a clock signal CLKDQ. Additionally, the selection circuit 10 may transmit second data, e.g., odd numbered data OD, to each pre-driver 20 and 30 in response to the other of the rising edge and the falling edge of the selection signal, e.g., the clock signal CLKDQ.

The first pre-driver 20 outputs a first control signal Pull-up, i.e., a pull-up signal PU, according to data, e.g., inverted first data or inverted second data, output from the selection circuit 10.

The second pre-driver 30, which may be embodied in an inverter, inverts data once again, e.g., the inverted first data or inverted second data, output from the selection circuit 10 and outputs a second control signal Pull-down, i.e., a pull down signal PD. The small circles of FIG. 1 illustrate data inversion.

The pre-driver circuit includes the selection circuit 10 and the plurality of pre-drivers 20 and 30. The pre-driver circuit outputs a pull-up signal PU and a pull down signal PD, which are complementary to each other, based on a clock signal CLKDQ and data ED or OD.

The output driver 100A includes a pull-up driver 101 and a pull down driver 103 which are connected in series between a voltage line (or node) supplying a power (supply) voltage VDDQ and a ground line (or node) at a ground voltage VSSQ.

Each of the pull-up driver 101 and the pull-down driver 103 may be embodied in an NMOS transistor. The first control signal Pull-up PD is supplied to a control terminal of the pull up driver 101, e.g., a gate of an NMOS transistor, and the second control signal Pull-down PD is supplied to a control terminal of the pull down driver 103, e.g., a gate of an NMOS transistor.

When an NMOS transistor is embodied in the pull up driver 101, the output driver 100A may operate at a relatively high frequency, as electron mobility of an NMOS transistor associated with pull up driver 101 is greater than hole mobility of a PMOS transistor.

When the first control signal Pull-up having a high level is supplied to a gate of the NMOS transistor associated with pull up driver 101, a voltage VOH of an output terminal 105 of the output driver 100A is decreased to (VDDQ−Vth). Here, Vth means a threshold voltage of the NMOS transistor associated with pull up driver 101. Accordingly, an output voltage VOH of the output driver 100A can be a small swing in a high frequency.

The output terminal 105 of the output driver 100A of the first device 2000 is connected to the second device 3000 through a data pad DQ and a channel 200.

The second device 3000 performing a function of a receiver includes a termination resistor Rterm and a sense amplifier 3100.

The termination resistor Rterm is connected between an input terminal Din of the second device 3000 and a ground line (or node) receiving a ground voltage VSSQ. The termination resistor Rterm is an equivalent resistor and may include a resistor R and a switch connected in series between the input terminal Din and the ground line. The switch may be turned ON or OFF in response to a switching control signal CTRL. According to an example embodiment, the switch may be embodied in a PMOS transistor or an NMOS transistor.

For example, when data signals are received through the channel 200, the switch may be turned ON in response to a switching control signal CTRL. Since the NMOS transistor associated with pull up driver 101 operates in a saturation region when the NMOS transistor associated with pull up driver 101 is turned on, the NMOS transistor associated with pull up driver 101 may operate as a current source automatically.

The sense amplifier 3100 may generate differential output signals Q and QB by sensing and amplifying a difference between a voltage of the input terminal Din and a reference voltage Vref in response to an inverted clock signal CKB. The pull up driver 101 and the pull down driver 103 may have a stack structure.

FIG. 2a is a schematic drawing illustrating an operation of a pull-up driver of the output driver of FIG. 1 and FIG. 2b is a timing diagram of an output signal according to the operation illustrated in FIG. 2a.

Referring to FIGS. 1 and 2, when the NMOS transistor associated with pull up driver 101 is turned on in response to a first control signal Pull-up and an NMOS transistor associated with pull down driver 103 is turned off in response to a second control signal Pull-down, it is known that a maximum output voltage of the output driver 100A is limited to the difference, (VDDQ−Vth). During a pull-up operation, the NMOS transistor associated with pull up driver 101 performs a function of a current source. Here, a current IPU flowing in the NMOS transistor associated with pull up driver 101 is determined according to difference of (VDDQ−Vth) as shown in relationship 1.

$$IPU \propto k(VDDQ-Vth)^r \qquad \text{[Relationship 1]}$$

Here, k is a constant number, and r is an exponent. For example, r may be a real number between 1 and 2.

A voltage VOH of an output terminal 105 of the output driver 100A may be determined based on the current IPU flowing in the NMOS transistor associated with pull up driver 101 and the termination resistor Rterm. When the current IPU flowing in one of the NMOS transistor associated with pull up driver 101 and in the termination resistor Rterm is increased, the voltage VOH of the output terminal 105 of the output driver 100A increases.

An amount of the current IPU flowing in the NMOS transistor associated with pull up driver 101 and/or resistance of the termination resistor Rterm may be determined or selected properly based on signal integrity of data on the channel 200. As an amount of the IPU flowing in the NMOS transistor associated with pull up driver 101 may be changed according to changes in process, voltage and/or temperature, the current, IPU may be adjusted to retain an appropriate value by adjusting width of the NMOS transistor associated with pull up driver 101.

The NMOS transistor associated with pull up driver 101 pulls up an output terminal 105 to a pull-up voltage in response to a pull-up signal PU. The pull-up voltage may be a voltage related to a power voltage VDDQ, e.g., a maximum output voltage (VDDQ−Vth) of the output driver 100A; however, the pull-up voltage may be simply expressed as a power voltage VDDQ.

FIG. 3a is a schematic drawing illustrating an operation of a pull-down driver of the output driver of FIG. 1. FIG. 3b is a timing diagram of an output signal according to the operation illustrated in FIG. 3a. Referring to FIGS. 1, 3a and 3b, when the NMOS transistor associated with pull up driver 101 is turned off in response to a first control signal Pull-up and the NMOS transistor associated with pull down driver 103 is turned on in response to a second control signal Pull-down, a voltage VOL of the output terminal 105 of the output driver 100A converges to a ground voltage VSSQ. A current IRterm of the output terminal 105 of the output driver 100A is sunk to a ground line through the termination resistor Rterm, and a current IPD of the output terminal 105 of the output driver 100A is sunk to the ground also through the NMOS transistor associated with pull down driver 103.

VOH of FIG. 3 is an initial voltage and Rterm is resistance of a termination resistor. A current IPD sunk to a ground through the NMOS transistor associated with pull down driver 103 is as shown in relationship 2.

$$IPD \propto k(VDDQ-Vth)r \qquad \text{[Relationship 2]}$$

Here, k is a constant number and r is an exponent. For example, r may be a real number between 1 and 2.

The NMOS transistor associated with pull down driver 103 pulls down a voltage of the output terminal 105 of the output driver 100A to a ground. For example, the NMOS transistor associated with pull down driver 103 has a pseudo-open drain structure which may operate without a pull-down driver.

FIGS. 4 to 9 illustrate other example embodiments of the output driver illustrated in FIG. 1. LUT, (low-voltage transistor) illustrated in each output driver 100B to 100G means that a threshold voltage of a corresponding NMOS transistor is designed to be lower than a threshold voltage of other NMOS transistors.

For example, a threshold voltage of each NMOS transistor associated with pull up drivers 101B, 101C, 103C, 104D, 104E, 106E, 103F, 101G and 106G is approximately 50 mV to 100 mV lower than a threshold voltage of each NMOS transistor associated with pull down drivers 103B, 101D, 103D, 101E, 103E, 101F and 103G.

That is, dopant density of an active region, e.g., a drain and a source, of each NMOS transistor associated with pull up driver 101B, 101C, 103C, 104D, 104E, 106E, 103F, 101G and 106G may be as much as 10 to 100 times higher than dopant density of an active region, e.g., a drain and a source, of each NMOS transistor 130B, 101D, 103D, 101E, 103E, 101F and 103G.

Figure 4:
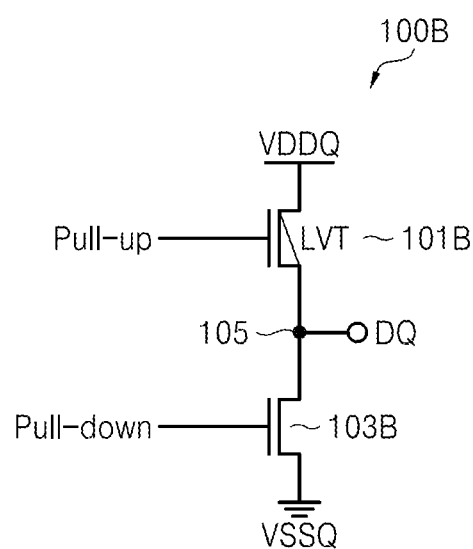
FIGS. 4 to 9 illustrate other example embodiments of the output driver illustrated in FIG. 1.

Referring to FIG. 4, an output driver 100B includes NMOS transistors associated with pull up driver 101B and with pull down driver 103B, connected in series between a voltage line supplying a power voltage VDDQ and a ground line at a ground voltage VSSQ. A threshold voltage of an NMOS transistor associated with pull up driver 101B may be designed to be relatively lower than a threshold voltage of an NMOS transistor associated with pull down driver 103B. For example, when a threshold voltage of the NMOS transistor associated with pull down driver 103B is 0.4V, a threshold voltage of the NMOS transistor associated with pull up driver 101B may be 0.30V to 0.35V. The output terminal 105 of the output driver 100B may be connected to the channel 200 through a data pad DQ.

Figure 5:
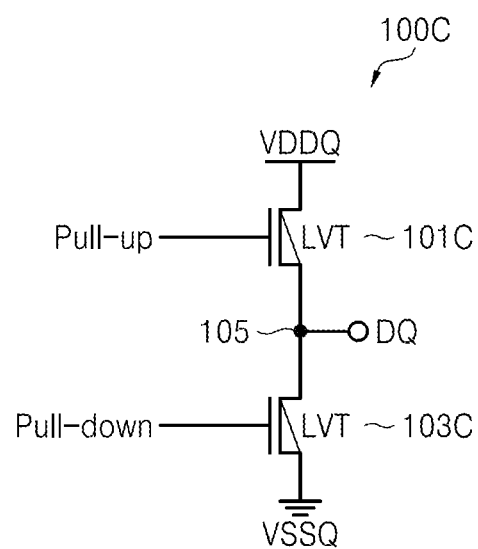

Referring to FIG. 5, an output driver 100C includes NMOS transistors associated with pull up drivers 101C and with pull down driver 103C connected in series between a voltage line supplying a power voltage VDDQ and a ground line at a ground voltage VSSQ. As described above, each of the NMOS transistors associated with pull up driver 101C and with pull down driver 103C may be embodied as an NMOS transistor having a comparatively low threshold voltage.

Figure 6:
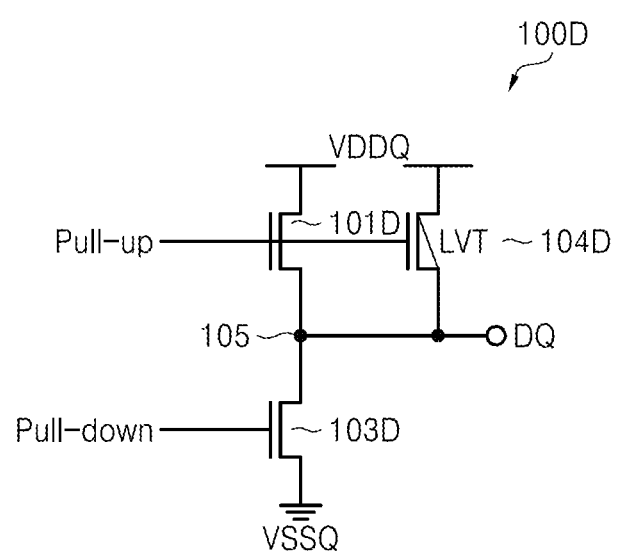

Referring to FIG. 6, an output driver 100D includes NMOS transistors associated with pull up driver 101D and with pull down driver 103D connected in series between a voltage line supplying a power voltage VDDQ and a ground line at a ground voltage VSSQ, and an NMOS transistor 104D connected between the voltage line and the output terminal 105. Each NMOS transistor associated with first pull up driver 101D and with second pull up driver 104D operates in response to a first control signal Pull-up. As described above, a threshold voltage of an NMOS transistor 104D may be designed to be relatively lower than a threshold voltage of each of the NMOS transistors associated with drivers 101D and 103D.

Figure 7:
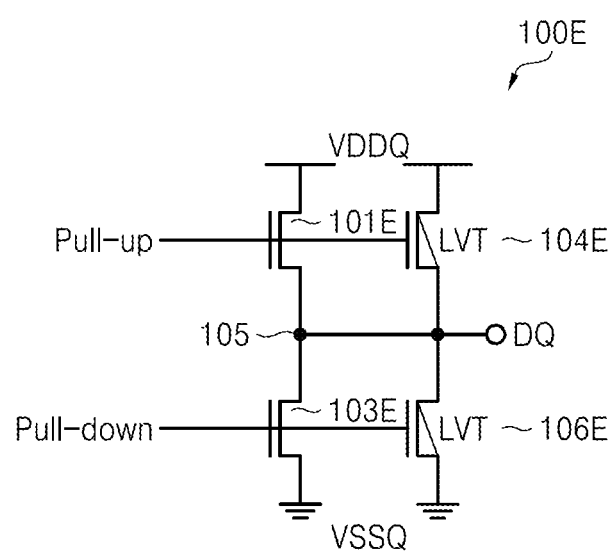

Referring to FIG. 7, an output driver 100E includes NMOS transistors associated with pull up driver 101E and with pull down driver 103E connected in series between the voltage line and the ground line, the NMOS transistor associated with second pull up driver 104E connected between the voltage line and the output terminal 105, and the NMOS transistor associated with second pull down driver 106E connected between the output terminal 105 and the ground line.

Each NMOS transistor associated with pull up drivers 101E and 104E is controlled by a first control signal Pull-up. Each NMOS transistor associated with pull down drivers 103E and 106E is controlled by a second control signal Pull-down. As described above, a threshold voltage of each NMOS transistor associated with drivers 104E and 106E may be designed to be lower than a threshold voltage of each NMOS transistor associated with drivers 101E and 103E.

Figure 8:
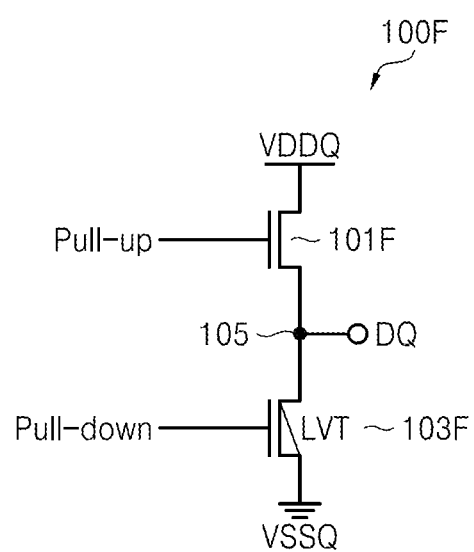

Referring to FIG. 8, an output driver 100F includes NMOS transistors associated with pull up driver 101F and with pull down driver 103F connected in series between a voltage line supplying a power voltage VDDQ and a ground line at a ground voltage VSSQ. As described above, a threshold voltage of the NMOS transistor associated with pull down driver 103F may be designed to be comparatively lower than a threshold voltage of the NMOS transistor associated with pull up driver 101F.

Figure 9:
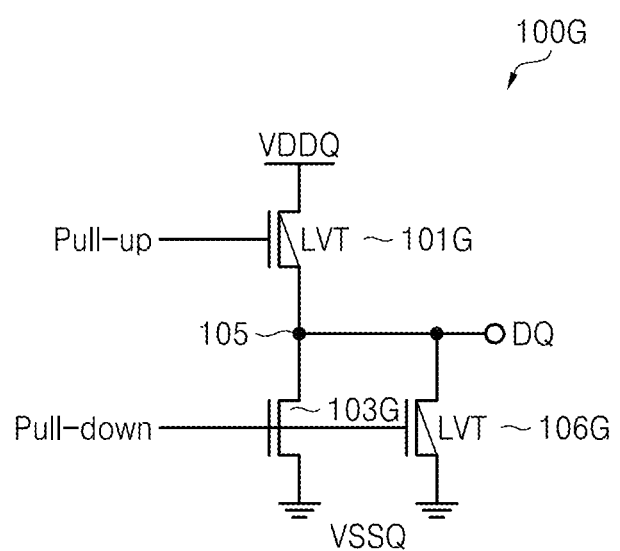

Referring to FIG. 9, an output driver 100G includes NMOS transistors 101G and 103G connected in series between the voltage line and the ground line, and the NMOS transistor 106G connected between the output terminal 105 and the ground line. As described above, a threshold voltage of each NMOS transistor associated with pull up driver 101G and second pull down driver 106G may be designed to be comparatively lower than a threshold voltage of the NMOS transistor associated with first pull down driver 103G.

As described above, since each output driver 100A to 100G uses at least one NMOS transistor as a pull-up driver, the output drivers 100A to 100G, each exhibit faster operation speed than an output driver using a PMOS transistor as a pull-up driver. As the layout area per current for each NMOS transistor-based output driver 100A to 100G is also smaller, lower input capacitance is exhibited. Accordingly, each output driver 100A to 100G may operate at a relatively high speed. Moreover, a termination using a ground voltage VSSQ may reduce power consumption compared to a termination using a power voltage VDDQ.

Figure 10:
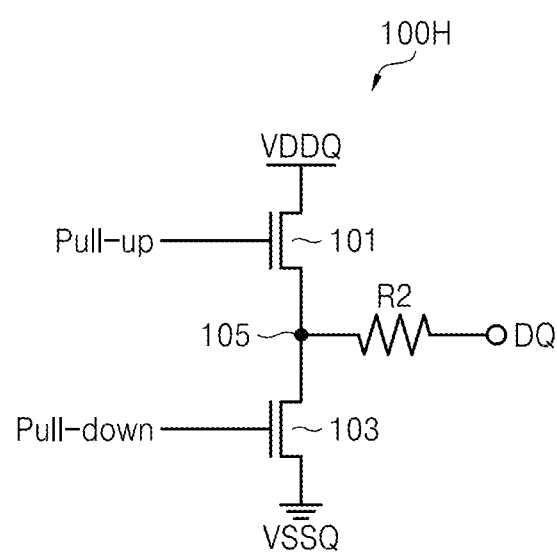
FIGS. 10 to 13 illustrate still other example embodiments of the output driver illustrated in FIG. 1.

FIGS. 10 to 13 are still other example embodiments of the output driver illustrated in FIG. 1. Referring to FIG. 10, an output driver 100H further includes a resistor R2 connected between the output terminal 105 and the data pad DQ.

Figure 11:
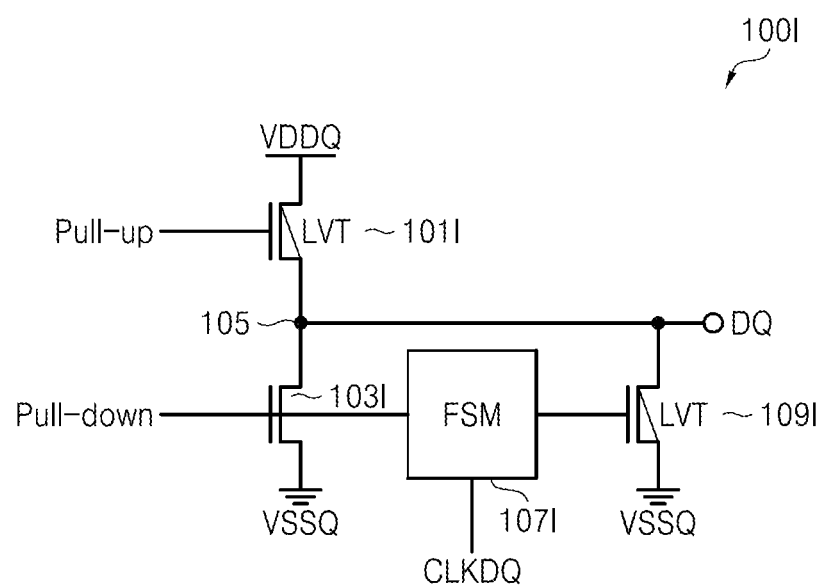

Referring to FIG. 11, an output driver 100I includes NMOS transistors associated with pull up driver 101I and with first pull down driver 103I connected in series between a voltage line (or node) supplying a power voltage VDDQ and a ground line (or node) at a ground voltage VSSQ, a control signal generation circuit 107I, and an NMOS transistor 109I connected between the output terminal 105 and the ground line.

The control signal generation circuit 107I generates a control signal which may control an ON/OFF state of the NMOS transistor associated with 109I based on a second control signal Pull-down and a clock signal CLKDQ.

The control signal generation circuit 107I may be embodied in a finite state machine (FSM). For example, the FSM associated with signal generation circuit 107I may determine a logic level of the second control signal Pull-down, which is input continuously, based on the clock signal CLKDQ and generate a control signal which may turn the NMOS transistor associated with second pull down driver 109I ON or OFF according to a determination result.

For example, when a logic level of the second control signal Pull-down is 1, 0, 1 and 0 at four different time points, the FSM associated with signal generation circuit 107I may determine that there is no data dependency and generate a control signal having a low level, which may turn the NMOS transistor associated with second pull down driver 109I OFF for de-emphasis of output data, according to a determination result.

However, when a logic level of the second control signal Pull-down is 1, 1, 1 and 0 (or 0, 0, 0 and 1) at four different time points, the FSM associated with signal generation circuit 107I may determine that there is data dependency and may generate a control signal having a high level, which may turn the NMOS transistor associated with second pull down driver 109I ON for pre-emphasis of output data, according to a determination result.

Figure 12:
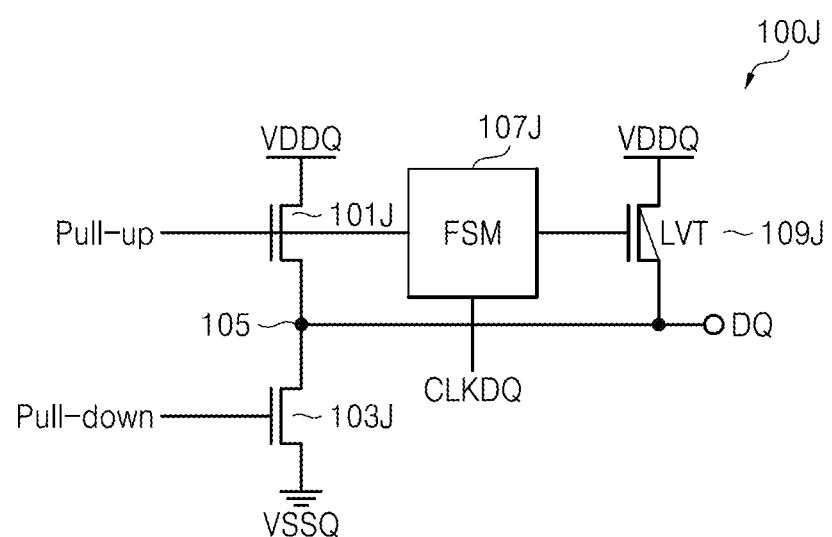

Referring to FIG. 12, an output driver 100J includes NMOS transistors associated with pull up driver 101J and with pull down driver 103J connected in series between a voltage line supplying a power voltage VDDQ and a ground line at a ground voltage VSSQ, a control signal generation circuit 107J and an NMOS transistor with second pull up driver 109J connected between the voltage line and the output terminal 105.

The control signal generation circuit 107J generates a control signal which may control an ON/OFF state of the NMOS transistor associated with second pull up driver 109J based on a clock signal CLKDQ and a first control signal Pull-up. The control signal generation circuit 107J may be embodied in an FSM. A function of the control signal generation circuit 107J is substantially the same as a function of the control signal generation circuit 107I explained above in reference to FIG. 11, therefore a detailed explanation is omitted.

Figure 13:
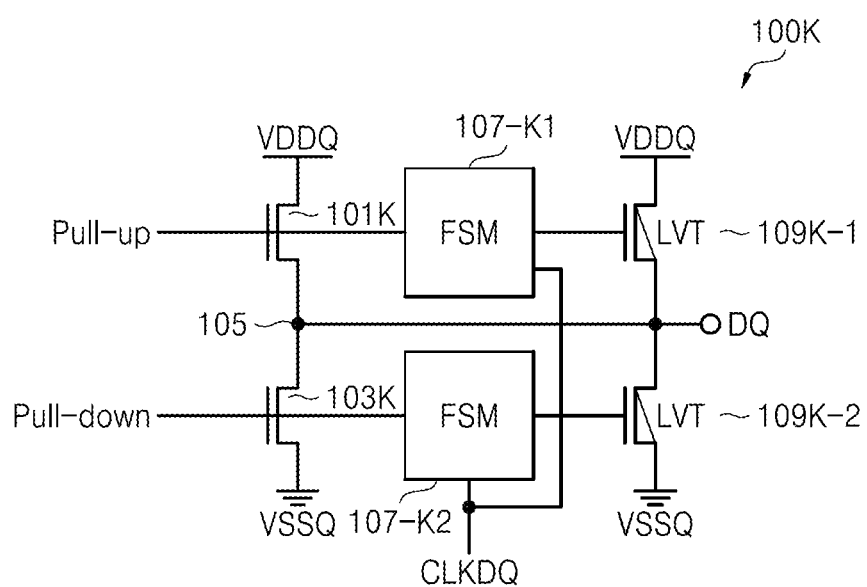

Referring to FIG. 13, an output driver 100K includes NMOS transistors associated with pull up driver 101K and with pull down driver 103K connected in series between a voltage line supplying a power voltage VDDQ and a ground line at a ground voltage VSSQ, a first control signal generation circuit 107-K1, a second control signal generation circuit 107-K2, an NMOS transistor associated with second pull up driver 109K-1 connected between the voltage line and the output terminal 105, and an NMOS transistor associated with second pull down driver 109K-2 connected between the output terminal 105 and the ground line.

Each control signal generation circuit 107-K1 and 107-K2 may be embodied in an FSM.

The first control signal generation circuit 107-K1 generates a control signal which may control an ON/OFF state of the NMOS transistor associated with second pull up driver 109K-1 based on a clock signal CLKDQ and a first control signal Pull-up.

The second control signal generation circuit 107-K2 generates a control signal which may control an ON/OFF state of the NMOS transistor associated with second pull down driver 109K-2 based on a clock signal CLKDQ and a second control signal Pull-down. A function of each control signal generation circuit 107-K1 and 107-K2 is substantially the same as a function of the control signal generation circuit 1071 explained referring to FIG. 11, therefore a detailed explanation is omitted.

NMOS transistors associated with pull up and pull down drivers 101B and 103B, 101C and 103C, 101D and 103D, 101E and 103E, 101F and 103F, 101G and 103G, 101 and 103, 101I and 103I, 101J and 103J, 101K and 103K, 104E and 106E, and 109K-1 and 109K-2, respectively, connected in series between the voltage lines and ground lines of output drivers 100B to 100K explained above, in reference to FIGS. 4 and 13 may have a stack structure.

Figure 14:
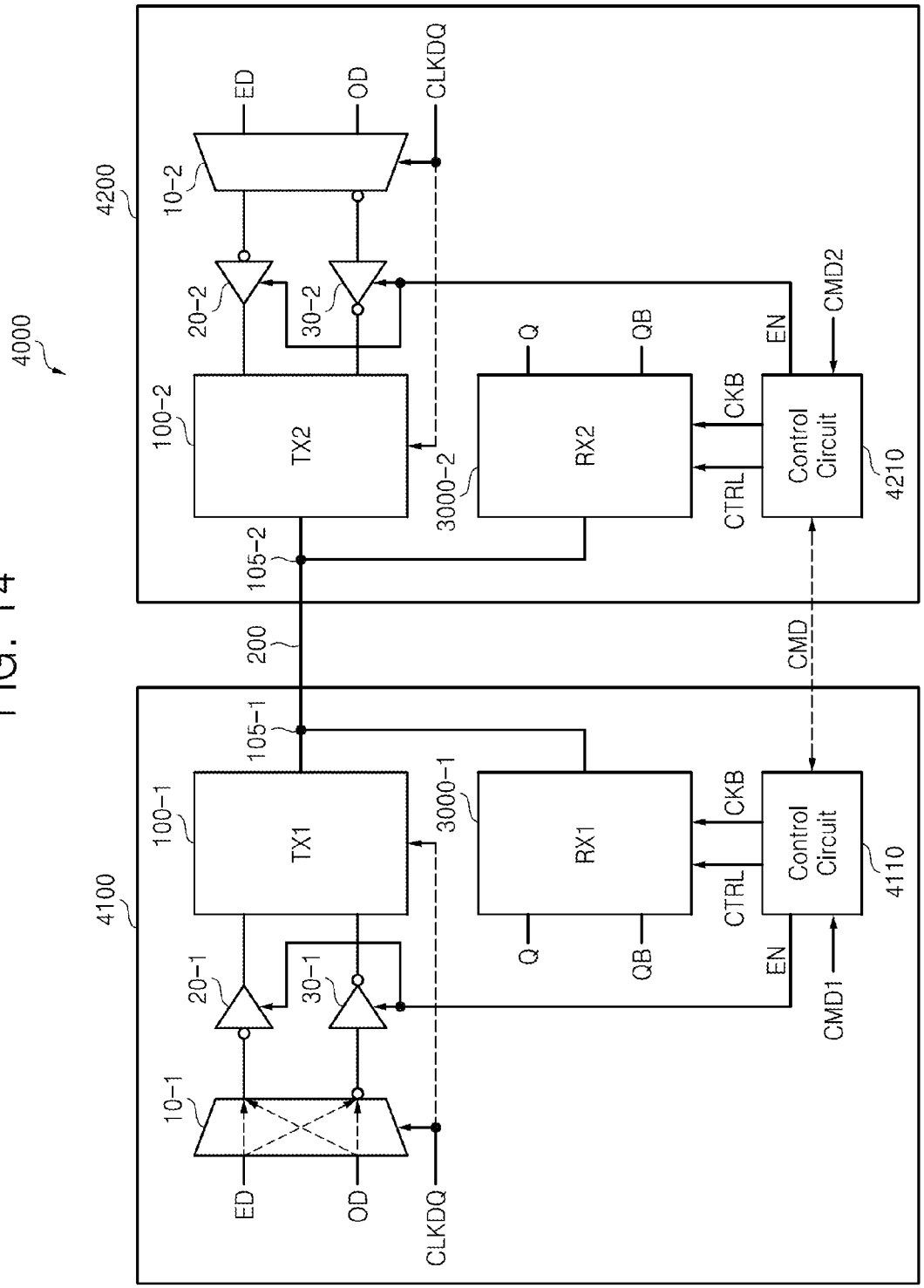
FIG. 14 is a block diagram of a system including the output driver and the ground termination according to an example embodiment of the present inventive concepts in FIG. 1.

FIG. 14 is a block diagram of a system including an output driver and a ground termination according to an example embodiment of the present inventive concepts of FIG. 1.

The system 4000 of FIG. 14 includes a first data processing circuit or device 4100 and a second data processing circuit or device 4200 which communicate with each other through the channel 200.

The first data processing circuit 4100 includes a first selection circuit 10-1, a first pre-driver circuit including pre-drivers 20-1 and 30-1, a first output driver 100-1, a first receiving circuit 3000-1, and a first control circuit 4110.

The second data processing circuit 4200 includes a second selection circuit 10-2, a second pre-driver circuit including pre-drivers 20-2 and 30-2, a second output driver 100-2, a second receiving circuit 3000-2 and a second control circuit 4210.

A structure and a function of each selection circuit 10- and 10-2 of FIG. 14 are the same as a structure and a function of the selection circuit 10 of FIG. 1.

Each pre-driver 20-1, 20-2, 30-1 and 30-2 may be enabled or disabled based on an enable signal EN output from each control circuit 4110 and 4210.

Each control circuit 4110 and 4210 may transmit or receive a command CMD for a data processing operation, e.g., a data transmission operation or a data receiving operation, which will be performed in each data processing circuit 4100 and 4200. For example, when the channel 200 is a unidirectional channel, each control circuit 4100 and 4210 may decode a transmitted or received command CMD, and generate each command CMD1 and CMD2 according to a decoding result.

An exemplary operation is explained as follows. A first data processing circuit 4100 transmits data to a second data processing circuit 4200 through the channel 200. A first control circuit 4110 receives a first data transmission command CMD1 and transmits a command CMD corresponding to the first data transmission command CMD1 to a second control circuit 4210. The first control circuit 4110 transmits an activated enable signal EN to each first pre-driver 20-1 and 30-1 in response to a first data transmission command CMD1.

Each enabled first pre-driver 20-1 and 30-1 generates control signals PU and PD which are complementary to each other based on data ED or OD. Accordingly, a first output driver 100-1 may transmit corresponding data to the second data processing circuit 4200 through the channel 200 in response to control signals PU or PD (control signals PU and PD are complimentary to each other).

In addition, the first control circuit 4110 blocks a clock signal CKB supplied to a first receiving circuit 3000-1 in response to a first data transmission command CMD1. Subsequently, the first receiving circuit 3000-1 becomes disabled.

The second control circuit 4210 decodes a command CMD and transmits an inactivated enable signal EN to each second pre-driver 20-2 and 30-2 according to a decoding result. Accordingly, each second pre-driver 20-2 and 30-2 becomes disabled. The second control circuit 4210 supplies a clock signal CKB and a control signal CTRL having a high level to a second receiving circuit 3000-2 according to the decoding result. Accordingly, the second receiving circuit 3000-2 may receive and process data transmitted from the first data processing circuit 4100 through the channel 200.

Continuing this explanation of exemplary operation, the second data processing circuit 4200 transmits data to the first data processing circuit 4100 through the channel 200.

The second control circuit 4210 receives a second data transmission command CMD2 and transmits a command CMD corresponding to the second data transmission command CMD2 to the first control circuit 4110. The second control circuit 4210 transmits an activated enable signal EN to each second pre-driver 20-2 and 30-2 in response to the second data transmission command CMD2.

Each enabled second pre-driver 20-2 and 30-2 generates control signals PU and PD, which are complementary to each other, based on data ED or OD. Accordingly, a second output driver 100-2 may transmit corresponding data to the first data processing circuit 4100 through the channel 200 in response to the control signals PU and PD which are complementary to each other. Additionally, the second control circuit 4210 blocks a clock signal CKB supplied to the second receiving circuit 3000-2 in response to a second data transmission command CMD2. Accordingly, the second receiving circuit 3000-2 is disabled.

The first control circuit 4110 decodes a command CMD and transmits an inactivated enable signal EN to each first pre-driver 20-1 and 30-1 according to a decoding result. Accordingly, each first pre-driver 20-1 and 30-1 is disabled. In addition, the first control circuit 4110 supplies a clock signal CKB and a control signal CTRL having a high level to the first receiving circuit 3000-1 according to the decoding result. Subsequently, the first receiving circuit 3000-1 may receive and process data transmitted from the second data processing circuit 4200 through the channel 200.

Each output driver 100-1 and 100-2 may be embodied in one of output drivers 100A to 100K. When each output driver 100-1 and 100-2 is embodied in one of output drivers 100I to 100K including an FSM, a clock signal CLKDQ is supplied to the one output driver.

As another example, when the channel is a bidirectional channel, a first output driver 100-1 and a first receiving circuit 3000-1 which are connected to a first output terminal 105-1 are enabled, and a second output driver 100-2 and a second receiving circuit 3000-2 which are connected to a second output terminal 105-2 are enabled.

Each control circuit 4110 and 4210 supplies a clock signal CKB and a control signal CTRL having a high level to each receiving circuit 3000-1 and 3000-2. Each control circuit

4110 and 4210 may supply an activated enable signal EN to each pre-driver 20-1, 20-2, 30-1 and 30-2.

A function and a structure of each receiving circuit 3000-1 and 3000-2 are substantially the same as a function and a structure of the second device 3000 illustrated in FIG. 1.

FIG. 14 illustrates that each control circuit 4110 and 4210 supplies an activated enable signal EN to each pre-driver 20-1, 20-2, 30-1 and 30-2; however, an enable signal EN itself may not be supplied to each pre-driver 20-1, 20-2, 30-1 and 30-2 when the channel is a bi-directional channel.

The first data processing circuit 4100 may be a master using a serial communication protocol or a serial communication standard, and the second data processing circuit 4200 may be a slave using the serial communication protocol or the serial communication standard.

A device using the serial communication protocol or the serial communication standard may be a universal asynchronous receiver transmitter (UART), a serial peripheral interface (SPI), an inter-integrated circuit (I2C), a system management bus (SMBus), a controller area network (CAN), a universal serial bus (USB), a camera serial interface (CSI) according to a mobile industry processor interface (MIPI®), a display serial interface (DSI) according to the MIPI®, a mobile display digital interface (MDDI), a local interconnect network (LIN), a displayport (DP) or an embedded DisplayPort (eDP).

According to an example embodiment, the first data processing circuit 4100, the channel 200 and the second data processing circuit 4200 may be embodied in an integrated circuit (IC) or a system-on chip (SoC).

According to another example embodiment, the first data processing circuit 4100, the channel 200 and the second data processing circuit 4200 may be embodied in a memory module.

According to still another example embodiment, the first data processing circuit 4100, the channel 200 and the second data processing circuit 4200 may be embodied in a multi-chip package (MCP). According to still other example embodiments, the first data processing circuit 4100, the channel 200 and the second data processing circuit 4200 may be embodied in: a Package On Package (PoP), Ball Grid Arrays (BGAs), Chip Scale Packages (CSPs), a Plastic Leaded Chip Carrier (PLCC), a Plastic Dual In-Line Package (PDIP), a Chip On Board (COB), a CERamic Dual In-Line Package (CERDIP), a plastic metric quad flat pack (MQFP), a Thin Quad Flat Pack (TQFP), a small-outline integrated circuit (SOIC), a shrink small outline package (SSOP), a thin small outline (TSOP), a system in package (SIP), a wafer-level package (WLP) or a water-level processed stack package (WSP).

According to still another example embodiment, when a system 4000 further includes a central processing unit (CPU) or a processor which communicates with at least one of the first data processing circuit 4100 and the second data processing circuit 4200 through a data bus, the system 4000 may be embodied in a personal computer (PC) or a laptop computer.

According to still another example embodiment, the first data processing circuit 4100 may be a memory controller, and the second data processing circuit 4200 may be a volatile memory device or a non-volatile memory device. According to still another example embodiment, each of the first data processing circuit 4100 and the second data processing circuit 4200 may be a volatile memory device or a non-volatile memory device.

The volatile memory device may be embodied in a dynamic random access memory (DRAM), a static random access memory (SRAM), a thyristor RAM (T-RAM), a zero capacitor RAM (Z-RAM), or a Twin Transistor RAM (TTRAM).

The non-volatile memory device may be embodied in an Electrically Erasable Programmable Read-Only Memory (EEPROM), a flash memory, a Magnetic Ram (MRAM), a Spin-Transfer Torque MRAM, a Conductive bridging RAM (CBRAM), a Ferroelectric RAM (FeRAM), a Phase change RAM (PRAM), a Resistive RAM (RRAM or ReRAM), a Nanotube RRAM, a Polymer RAM (PoRAM), a Nano Floating Gate Memory (NFGM), a holographic memory, a Molecular Electronics Memory Device, or an Insulator Resistance Change Memory.

Figure 15:
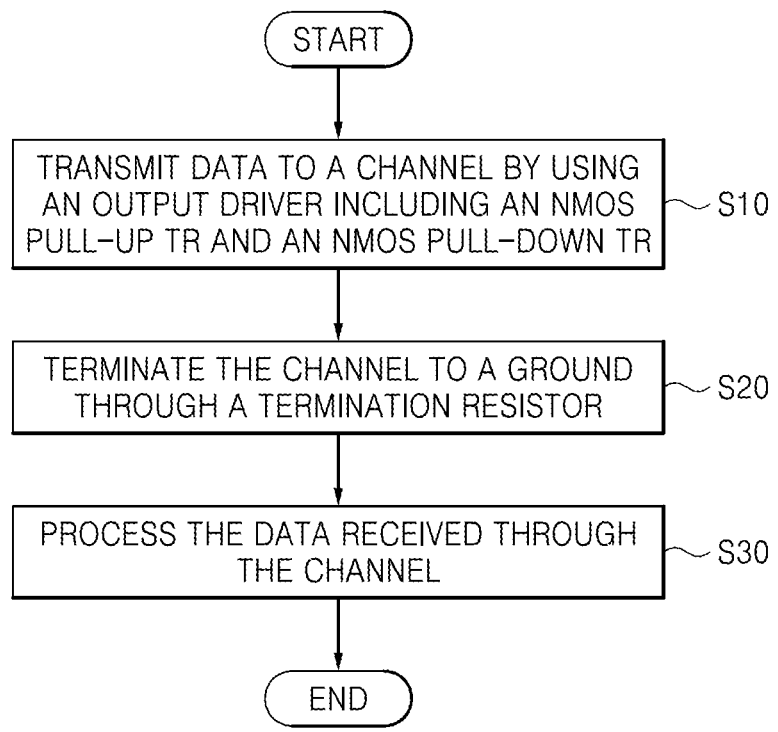
FIG. 15 is a flowchart for explaining the data transmission system of FIG. 1 or an operation of the system of FIG. 14.

FIG. 15 is a flowchart for explaining an exemplary operation of the data transmission system of FIG. 1 or the system of FIG. 14. Referring to FIGS. 1, 14 and 15, a pre-driver circuit generates a pull-up signal PU and a pull-down signal PD which are complementary to each other in response to data ED or OD.

Data are transmitted to the channel 200 by using an output driver 100A including the NMOS pull-up driver 101 and the NMOS pull down driver 103 (S10). For example, the output driver 100A transmits data to the channel 200 by using selectively, the NMOS pull-up driver 101 which operates in response to a pull up signal PU and the NMOS pull-down driver 103 which operates in response to a pull down signal PD. The channel 200 is terminated to a ground through the termination resistor Rterm (S20). The second receiving circuit 3000-2 processes, e.g., senses and amplifies, data input through the channel 200 (S30).

Figure 16:
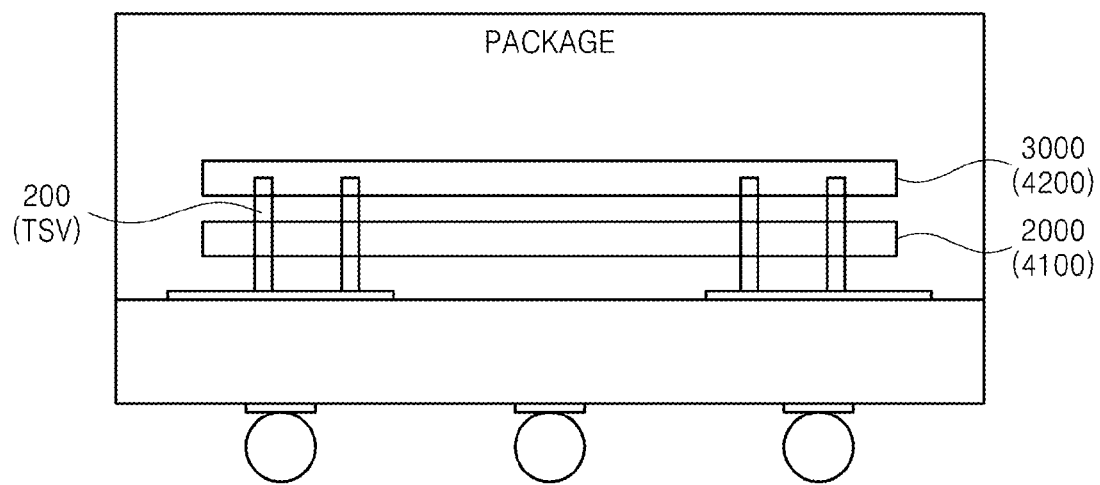
FIG. 16 is a cross-sectional diagram of a system including the output driver and the ground termination illustrated in FIG. 1 or 14.

FIG. 16 is a cross-sectional diagram of a system including the output driver and the ground termination illustrated in FIG. 1 or FIG. 14. Referring to FIGS. 1 and 16, a system which may be embodied in a package may include the first device 2000 and the second device 3000 which perform data communication through the channel 200.

Here, each of the first device 2000 and the second device 3000 may be embodied in a different chip, and the channel 200 may be embodied in a vertical electrical connection (via), e.g., through silicon via (TSV).

Referring to FIGS. 14 and 16, a system which may be embodied in a package may include the first data processing circuit 4100 and the second data processing circuit 4200 which communicate through the channel 200. Each of the first data processing circuit 4100 and the second data processing circuit 4200 is embodied in a different chip, and the channel 200 may be embodied in a vertical electrical connection (via), e.g., TSV.

For example, a package may be embodied in: a Package On Package (PoP), Ball Grid Arrays, Chip Scale Packages (CSPs), a Plastic Leaded Chip Carrier (PLCC), a Plastic Dual in-line Package (PDIP), a Chip On Board (COB), a CERamic Dual In-line Package (CERDIP), a plastic metric quad flat pack (MQFP), a Thin Quad Flat Pack (TQFP), a small-outline integrated circuit (SOIC), a shrink small outline package (SSOP), a thin small outline package (TSOP), a system in package (SIP), a multi-chip package (MCP), a wafer-level package (WLP) or a wafer-level processed stack package (WSP).

Figure 17:
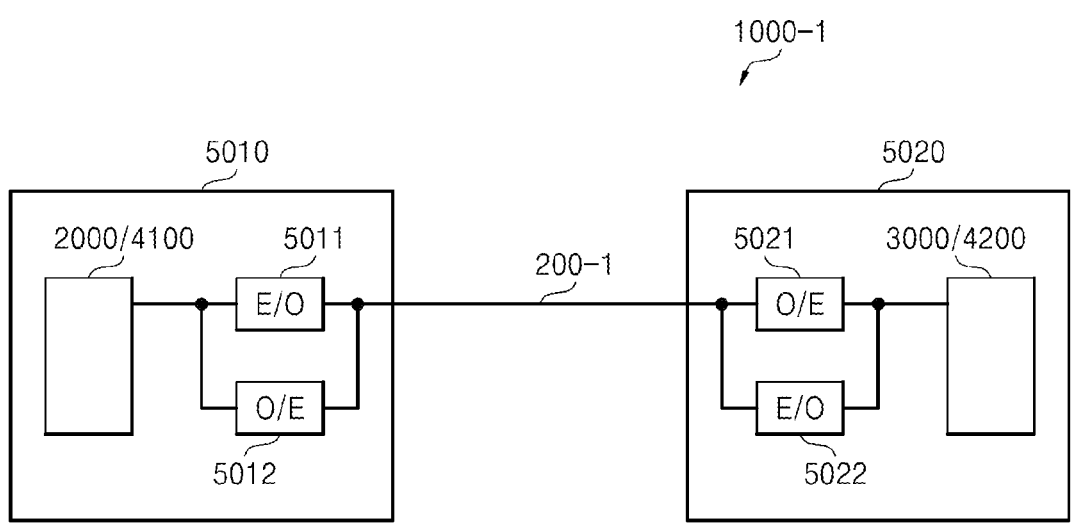
FIG. 17 is another example embodiment of the system including the output driver and the ground termination illustrated in FIG. 1 or 14.

FIG. 17 is another exemplary embodiment of a system including the output driver and the ground termination illustrated in FIG. 1 or 14. Referring to FIG. 17, a system 1000-1 may include a first system 5010 and a second system 5020 which perform data communication through a channel 200-1. The channel 200-1 may comprise an optical connection means.

Referring to FIGS. 1 and 17, the first system 5010 may include the first device 2000 and a first electrical-optical conversion circuit 5011. The first electrical-optical conversion circuit 5011 may convert an electrical signal output from the first device 2000 to an optical signal, and output a converted optical signal to the second system 5020 through channel 2001-1 which may comprise an optical connection means.

The second system 5020 includes a second optical-electrical conversion circuit 5021 and the second device 3000. The second optical-electrical conversion circuit 5021 may convert an optical signal input through the optical connection means 200-1 into an electrical signal, and transmit a converted electrical signal to the second device 3000.

Referring to FIGS. 14 and 17, the first system 5010 may include the first data processing circuit 4100 and the first electrical-optical conversion circuit 5011.

When the first system 5010 transmits data to the second system 5020, the first electrical-optical conversion circuit 5011 may convert an electrical signal output from the first data processing circuit 4100 into an optical signal, and output a converted optical signal to the second system 5020 through the optical connection means of 200-1.

The second system 5020 includes the second optical-electrical conversion circuit 5021 and the second data processing circuit 4200. The second optical-electrical conversion circuit 5021 may convert an optical signal input through the optical connection means 200-1 into an electrical signal, and transmit a converted electrical signal to the second data processing circuit 4200.

The first system 5010 may further include a third optical-electrical conversion circuit 5012, and the second system 5020 may further include a fourth electrical-optical conversion circuit 5022. When the second system 5020 transmits data to the first system 5010, the fourth electrical-optical conversion circuit 5022 may convert an electrical signal output from the second data processing circuit into an optical signal, and output a converted optical signal to the first system 5010 through the optical connection means 200-1. The third optical-electrical conversion circuit 5012 may convert an optical signal input through the optical connection means 200-1 into an electrical signal and transmit a converted electrical signal to the first data processing circuit 4100.

A pull-up driver of an output driver according to an example embodiment of the present inventive concepts uses an NMOS transistor instead of a PMOS transistor, so that it may process data at a high speed.

When an NMOS transistor which is used as a pull-up driver is turned on in a ground termination structure according to an example embodiment of the present inventive concepts, the NMOS transistor may operate as a current source automatically since the NMOS transistor operates in a saturation region.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. An integrated circuit (IC) comprising:
an output driver including;
an output terminal,
a first n-type metal-oxide semiconductor (NMOS) transistor configured to pull up a voltage of the output terminal to a pull-up voltage, in response to a pull-up signal, and
a second NMOS transistor configured to pull down the voltage of the output terminal to a ground voltage, in response to a pull-down signal; and
a receiving circuit including,
a termination resistor connected between the output terminal and a ground, and
a sense-amplifier configured to sense and to amplify data received from the output terminal in response to a clock signal.

2. The IC of claim 1, wherein the receiving circuit includes a switch connecting the termination resistor and the ground, the switch being activated in response to a control signal.

3. The IC of claim 1, further comprising:
a pre-driver circuit configured to generate the pull-up signal and the pull-down signal in response to an enable signal and in response to output data, the pull-up signal and the pull-down signal being complementary to each other; and
a control circuit configured to decode a command and to control activation of one of the enable signal and transmission of the clock signal based on a decoding result.

4. A system comprising:
a first data processing circuit including,
a first output driver having a first output terminal connected to a channel, and
a first sense amplifier configured to sense and to amplify first input data input through the first output terminal in response to a first clock signal; and
a second data processing circuit configured to communicate with the first data processing circuit via the channel, the first output driver including,
a first n-type metal-oxide semiconductor (NMOS) transistor configured to pull up a voltage of the first output terminal to a pull-up voltage of the first data processing circuit in response to a first pull-up signal, and
a second NMOS transistor configured to pull down a voltage of the first output terminal to a ground voltage of the first data processing circuit in response to a first pull-down signal,
the second data processing circuit including a first termination resistor connected between the channel and a ground of the second data processing circuit.

5. The system of claim 4, wherein
the first data processing circuit includes a second termination resistor connected between the channel and a ground of the first data processing circuit,
the second data processing circuit further includes a second output driver having a second output terminal connected to the channel,
the second output driver includes,
a third NMOS transistor configured to pull up a voltage of the second output terminal to a pull-up voltage of the second data processing circuit in response to a second pull-up signal; and
a fourth NMOS transistor configured to pull down the voltage of the second output terminal to a ground voltage of the second data processing circuit in response to a second pull-down signal.

6. The system of claim 4, wherein
the first data processing circuit includes,
a first pre-driver circuit configured to generate the first pull-up signal and the first pull-down signal in response to first output data, the first pull-up signal and the first pull-down signal being complementary to each other, and the second data processing circuit includes,
- a second pre-driver circuit configured to generate the second pull-up signal and the second pull-down signal, in response to second output data, the second pull-up signal and the second pull-down signal being complementary to each other; and
- a second sense amplifier configured to sense and to amplify second input data input through the second output terminal in response to a second clock signal.

7. The system of claim 6, wherein the channel is a bidirectional data bus.

8. The system of claim 4, wherein the channel is configured to transmit optical signals.

9. The system of claim 4, wherein the first data processing circuit further comprises:
- a first pre-driver circuit configured to generate the first pull-up signal and the first pull-down signal, in response to a first enable signal and first output data, the first pull-up signal and the first pull-down signal being complementary to each other; and
- a first control circuit configured to decode a first command and to control activation of the first enable signal or transmission of the first clock signal according to a decoding result.

10. The system of claim 9, wherein the second data processing circuit further comprises:
- a second pre-driver circuit configured to generate the second pull-up signal and the second pull-down signal, in response to a second enable signal and second output data, the second pull-up signal and the second pull-down signal being complementary to each other;
- a second sense-amplifier configured to sense and to amplify second input data input through the second output terminal, in response to a second clock signal; and
- a second control circuit configured to decode a second command and to control activation of the second enable signal or transmission of the second clock signal according to a decoding result.

11. The system of claim 4, wherein the system is a system-on chip.

12. The system of claim 4, wherein the first data processing circuit is a master configured to use a serial communication protocol and the second data processing circuit is a slave configured to use the serial communication protocol.

13. The system of claim 4, wherein the system is a multi-chip package.

14. The system of claim 4, wherein
the first data processing circuit and the second data processing circuit are mounted on a board, and
the system is a memory module.

15. The system of claim 4, further comprising:
a central processing unit (CPU) configured to communicate with the first data processing circuit and the second data processing circuit through a data bus, wherein the system is any one of a personal computer (PC), a laptop computer and a handheld device.

16. An integrated circuit (IC) comprising:
- a first n-type metal-oxide semiconductor (NMOS) transistor configured to pull up a voltage of an output terminal to a pull-up voltage in response to a pull-up signal;
- a second NMOS transistor configured to pull down the voltage of the output terminal to a ground voltage in response to a pull-down signal;
- a selection circuit configured to selectively output one of first data and second data in response to a clock signal;
- a first pre-driver circuit configured to output the pull-up signal in response to output data of the selection circuit; and
- a second-pre-driver circuit configured to output the pull-down signal in response to the output data of the selection circuit,
wherein the pull-up signal and the pull-down signal are complementary to each other.

17. The IC of claim 16, further comprising:
a resistance circuit connected between the output terminal and a data pad.

18. The IC of claim 16, wherein a difference between a threshold voltage of the first NMOS transistor and a threshold voltage of the second NMOS transistor is 50 mV to 100 mV.

19. The IC of claim 16, further comprising:
- a control signal generation circuit configured to generate a control signal in response to the clock signal and the pull-down signal; and
- a third NMOS transistor configured to pull down the voltage of the output terminal to the ground voltage in response to the control signal.

20. The IC of claim 16, further comprising:
- a control signal generation circuit configured to determine dependency of the pull-down signal input at each time point in response to the clock signal and to generate a control signal according to a determination result; and
- a third NMOS transistor configured to pull down the voltage of the output terminal to the ground voltage in response to the control signal.

* * * * *